United States Patent
Narwankar et al.

(10) Patent No.: US 8,662,941 B2
(45) Date of Patent: Mar. 4, 2014

(54) WIRE HOLDER AND TERMINAL CONNECTOR FOR HOT WIRE CHEMICAL VAPOR DEPOSITION CHAMBER

(75) Inventors: Pravin Narwankar, Sunnyvale, CA (US); Victor Pushparaj, Sunnyvale, CA (US); Dieter Haas, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 38 days.

(21) Appl. No.: 13/454,317

(22) Filed: Apr. 24, 2012

(65) Prior Publication Data

US 2012/0289078 A1  Nov. 15, 2012

Related U.S. Application Data

(60) Provisional application No. 61/485,360, filed on May 12, 2011.

(51) Int. Cl.
*H01R 4/16* (2006.01)

(52) U.S. Cl.
USPC ......................................................... 439/804

(58) Field of Classification Search
USPC ........... 118/718, 724, 723; 439/804, 801, 819
See application file for complete search history.

(56) References Cited

U.S. PATENT DOCUMENTS

| | | | | |
|---|---|---|---|---|
| 5,344,492 A | * | 9/1994 | Sato et al. ...................... | 118/725 |
| 5,781,692 A | * | 7/1998 | Wagner .......................... | 392/411 |
| 5,929,373 A | * | 7/1999 | Schiavo et al. ............. | 174/17.08 |
| 6,258,408 B1 | * | 7/2001 | Madan et al. ................ | 427/255.5 |
| 6,427,622 B2 | * | 8/2002 | Madan et al. ........... | 118/723 HC |
| 6,488,777 B2 | * | 12/2002 | Madan et al. .................. | 118/718 |
| 6,593,548 B2 | | 7/2003 | Matsumura et al. | |
| 6,942,892 B1 | | 9/2005 | Ishibashi | |
| 7,211,152 B2 | * | 5/2007 | Ishibashi et al. .............. | 118/724 |
| 8,328,561 B2 | * | 12/2012 | Priddy ............................ | 439/32 |
| 2009/0277386 A1 | | 11/2009 | Takagi et al. | |
| 2012/0289078 A1 | * | 11/2012 | Narwankar et al. ........... | 439/485 |
| 2012/0295419 A1 | | 11/2012 | Chatterjee et al. | |
| 2012/0312326 A1 | | 12/2012 | Chatterjee et al. | |
| 2013/0041084 A1 | | 2/2013 | Chatterjee et al. | |
| 2013/0048987 A1 | | 2/2013 | Chatterjee | |
| 2013/0065401 A1 | | 3/2013 | Chatterjee et al. | |

OTHER PUBLICATIONS

International Search Report and Written Opinion mailed Jan. 24, 2012 for PCT Application No. PCT/US2012/041078.
International Search Report and Written Opinion mailed Mar. 4, 2012 for PCT Application No. PCT/US2012/054575.

* cited by examiner

*Primary Examiner* — Neil Abrams
*Assistant Examiner* — Phuong T Nguyen
(74) *Attorney, Agent, or Firm* — Moser Taboada; Alan Taboada

(57) ABSTRACT

Apparatus for supporting the wires in a hot wire chemical vapor deposition (HWCVD) system are provided herein. In some embodiments, a terminal connector for a hot wire chemical vapor deposition (HWCVD) system may include a base; a wire clamp moveably disposed with relation to the base along an axis; a reflector shield extending from the wire clamp in a first direction along the axis; and a tensioner coupled to the base and wire clamp to bias the wire clamp in a second direction opposite the first direction.

17 Claims, 4 Drawing Sheets

WIRE HOLDER AND TERMINAL CONNECTOR FOR HOT WIRE CHEMICAL VAPOR DEPOSITION CHAMBER

CROSS-REFERENCE TO RELATED APPLICATIONS

This application claims benefit of U.S. provisional patent application Ser. No. 61/485,360, filed May 12, 2011, which is herein incorporated by reference in its entirety.

FIELD

Embodiments of the present invention generally relate to semiconductor processing using hot wire chemical vapor deposition systems.

BACKGROUND

In hot wire chemical vapor deposition (HWCVD) processes, one or more precursor gases are thermally decomposed at a high temperature within a process chamber proximate a substrate upon which a desired material is to be deposited. The thermal decomposition reaction is facilitated within the process chamber by one or more wires, or filaments, supported in the process chamber that may be heated to a desired temperature, for example, by passing electrical current through the filaments.

A current method of keeping a wire tense in the vertical plane is to clamp the wire in a vertical plane with a weight attached at the end, thereby providing tension via gravity. A current method of keeping a wire tense in the horizontal plane is to use short lengths of wire attached to a frame within the HWCVD process chamber, such that expansion of the short wires does not cause instability. A current method of protecting the wire at the terminal connection area is to use gas flows to create a positive pressure around the terminal connection area, thereby preventing process gases from entering into the wire terminal connection area.

Therefore, the inventors have provided an improved method and apparatus for tensioning the wires in HWCVD process chambers.

SUMMARY

Apparatus for supporting the wires in a hot wire chemical vapor deposition (HWCVD) system are provided herein. In some embodiments, a terminal connector for a hot wire chemical vapor deposition (HWCVD) system may include a base; a wire clamp moveably disposed with relation to the base along an axis; a reflector shield extending from the wire clamp in a first direction along the axis; and a tensioner coupled to the base and wire clamp to bias the wire clamp in a second direction opposite the first direction.

In some embodiments, a terminal connector for a HWCVD system may include a base; a wire clamp moveably disposed with relation to the base along an axis; a guide disposed through the base to constrain movement of the wire clamp in all directions except for linear movement of the wire clamp with relation to the base; a reflector shield extending from the wire clamp in a first direction along the axis, the reflector shield comprising an inner wall defining a cylindrical opening aligned with the axis and extending along the axis to cover the wire, wherein the inner wall is polished to reflect heat; and a tensioner coupled to the base and wire clamp to bias the wire clamp in a second direction opposite the first direction.

In some embodiments, a terminal connector for a HWCVD system may include a base; a wire clamp moveably disposed with relation to the base along an axis; a guide disposed through the base to constrain movement of the wire clamp in all directions except for linear movement of the wire clamp with relation to the base; a reflector shield extending from the wire clamp in a first direction along the axis and through the guide; a spring wound around the reflector shield and coupled between the base and the wire clamp to bias the wire clamp away from the base; and an electrical connector electrically coupled to the wire clamp to provide electrical power to a wire when retained in the wire clamp during use.

Other and further embodiments are described below.

BRIEF DESCRIPTION OF THE DRAWINGS

Embodiments of the present invention, briefly summarized above and discussed in greater detail below, can be understood by reference to the illustrative embodiments of the invention depicted in the appended drawings. It is to be noted, however, that the appended drawings illustrate only typical embodiments of this invention and are therefore not to be considered limiting of its scope, for the invention may admit to other equally effective embodiments.

Figure 1:
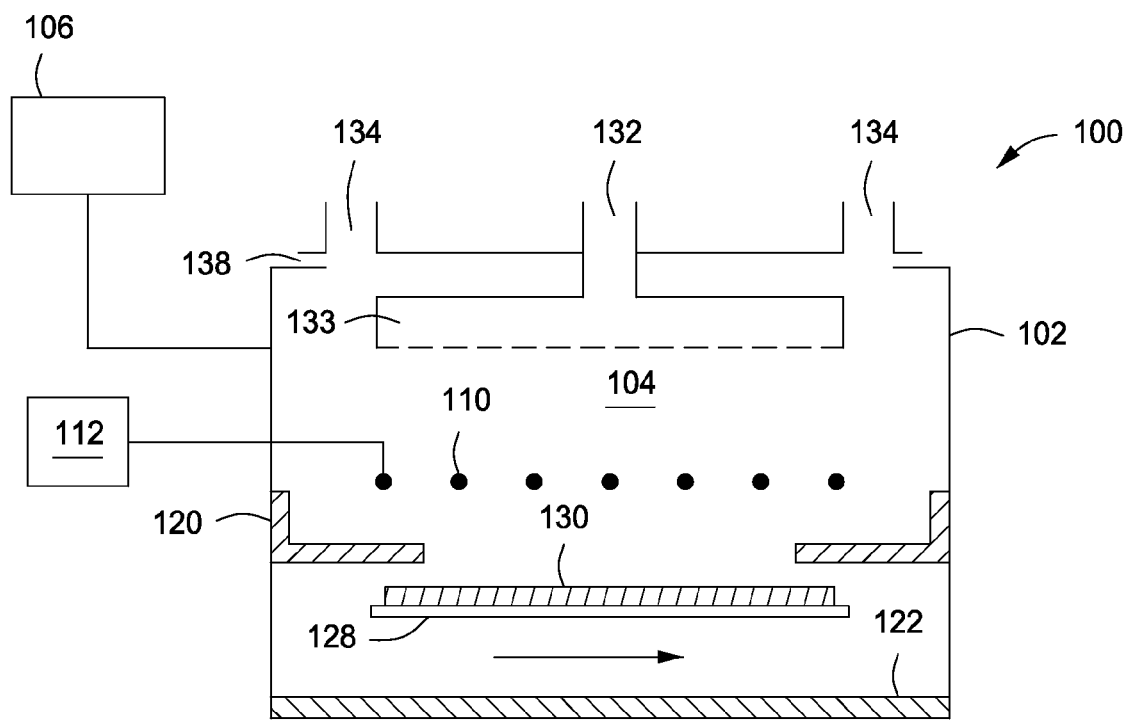
FIG. 1 is a schematic side view of a hot wire CVD process chamber in accordance with some embodiments of the present invention.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Embodiments of the present invention provide improved methods and apparatus for tensioning the wires in a hot wire chemical vapor deposition (HWCVD) process chamber and for shielding the wire at the terminal connection from precursor gases used in the HWCVD process chamber. Embodiments of the present invention may be used in various HWCVD processes. For example, HWCVD can be used to deposit of amorphous silicon p-i-n structures, suitable for fabricating solar devices. In addition HWCVD may be used to deposit other thin films and structures. For example, HWCVD may be used to deposit metal-polymer nano-composites.

FIG. 1 depicts a schematic side view of a HWCVD process chamber 100 suitable for use in accordance with embodiments of the present invention. The process chamber 100 generally comprises a chamber body 102 having an internal processing volume 104. A plurality of filaments, or wires 110, are disposed within the chamber body 102 (e.g., within the internal processing volume 104). The plurality of wires 110 may also be a single wire routed back and forth across the internal processing volume 104. The plurality of wires 110 comprise a HWCVD source. The wires 110 may comprise any suitable conductive material, for example, tungsten, tantalum, iridium, or the like. The wires 110 may comprise any thickness suitable to provide a desired temperature to facilitate a process in the process chamber 100. For example, in some embodiments, each wire 110 may comprise a diameter of about 0.1 mm to about 3 mm, or in some embodiments, about 0.5 mm. The wires 110 used in the HWCVD system 100 are up to two to three meters long. The wires 110 expand as they are heated. Each wire 110 is clamped in place by a connector, such as described below with respect to FIGS. 2-4, to keep each wire taught when heated to high temperature, and to provide electrical contact to the wire 110 to facilitate heating the wire 110.

A power supply 112 is coupled to the wires 110 to provide current to heat the wires 110. The power supply 112 may be coupled to the wires 110 via the connector described below with respect to FIGS. 2-4. A substrate 130 may be positioned under the HWCVD source (e.g., the wires 110), for example, on a substrate support 128. The substrate support 128 may be stationary for static deposition, or may move for dynamic deposition as the substrate 130 passes under the HWCVD source.

The chamber body 102 further includes one or more gas inlets (one gas inlet 132 shown) to provide one or more process gases and one or more outlets (two outlets 134 shown) to a vacuum pump (not shown) to maintain a suitable operating pressure within the process chamber 100 and to remove excess process gases and/or process byproducts. The gas inlet 132 may feed into a shower head 133 (as shown), or other suitable gas distribution element, to distribute the gas uniformly, or as desired, over the wires 110.

In some embodiments, one or more shields 120 may be provided to minimize unwanted deposition on interior surfaces of the chamber body 102. Alternatively or in combination, one or more chamber liners 122 can be used to make cleaning easier. The use of shields, and liners, may preclude or reduce the use of undesirable cleaning gases, such as the greenhouse gas $NF_3$. The shields 120 and chamber liners 122 generally protect the interior surfaces of the chamber body 102 from undesirably collecting deposited materials due to the process gases flowing in the chamber. The shields 120 and chamber liners 122 may be removable, replaceable, and/or cleanable. The shields 120 and chamber liners 122 may be configured to cover every area of the chamber body that could become coated, including but not limited to, around the wires 110 and on all walls of the coating compartment. Typically, the shields 120 and chamber liners 122 may be fabricated from aluminum (Al) and may have a roughened surface to enhance adhesion of deposited materials (to prevent flaking off of deposited material). The shields 120 and chamber liners 122 may be mounted in the desired areas of the process chamber 100, such as around the HWCVD sources, in any suitable manner. In some embodiments, the source, shields, and liners may be removed for maintenance and cleaning by opening an upper portion of the process chamber 100. For example, in some embodiments, the lid, or ceiling, of the process chamber 100 may be coupled to the chamber body 102 along a flange 138 that supports the lid and provides a surface to secure the lid to the chamber body 102.

A controller 106 may be coupled to various components of the process chamber 100 to control the operation thereof. Although schematically shown coupled to the process chamber 100, the controller 106 may be operably connected to any component that may be controlled by the controller 106, such as the power supply 112, a gas supply (not shown) coupled to the inlet 132, a vacuum pump and or throttle valve (not shown) coupled to the outlet 134, the substrate support 128, and the like, in order to control the HWCVD deposition process. The controller 106 may be one of any form of general-purpose computer processor that can be used in an industrial setting for controlling various chambers and sub-processors.

Figure 2:
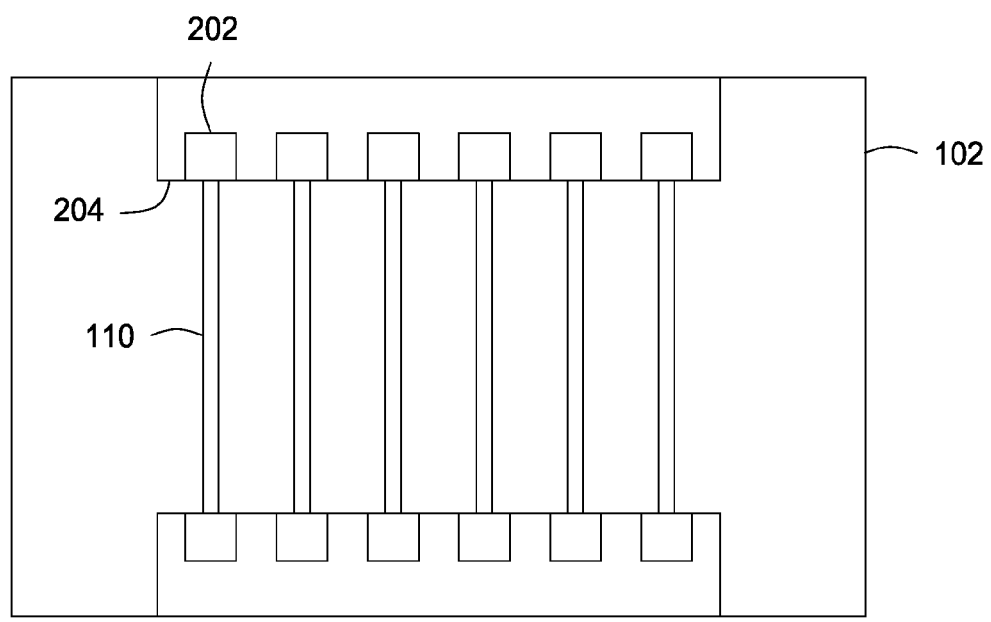
FIG. 2 is a schematic top view of the wire arrangement in a hot wire CVD process chamber in accordance with some embodiments of the present invention

FIG. 2 depicts a partial schematic top view of the hot wire CVD process chamber 100 in accordance with some embodiments of the present invention. As shown in FIG. 2, the plurality of wires 110 disposed within the chamber body 102 may be coupled to a plurality of connectors 202. The connectors 202 may support the wires 110 in a desired position within the process chamber 100, for example, such as along the walls of the chamber body 102, although other locations may also be used. The connectors 202 may be coupled to support structures 204 to support the connectors 202 (and the wires 110), in a desired position and configuration within the process chamber 100. Alternatively or in combination, some or all of the connectors 202 may be mounted directly in or on the chamber body 102, or on some other component of the process chamber which may act as the support structure 204. In addition, the support structures 204 may include one or more pieces and may be coupled together to form a singular structure or may be provided as a plurality of support structures on either side of the process chamber 100.

Figure 3:
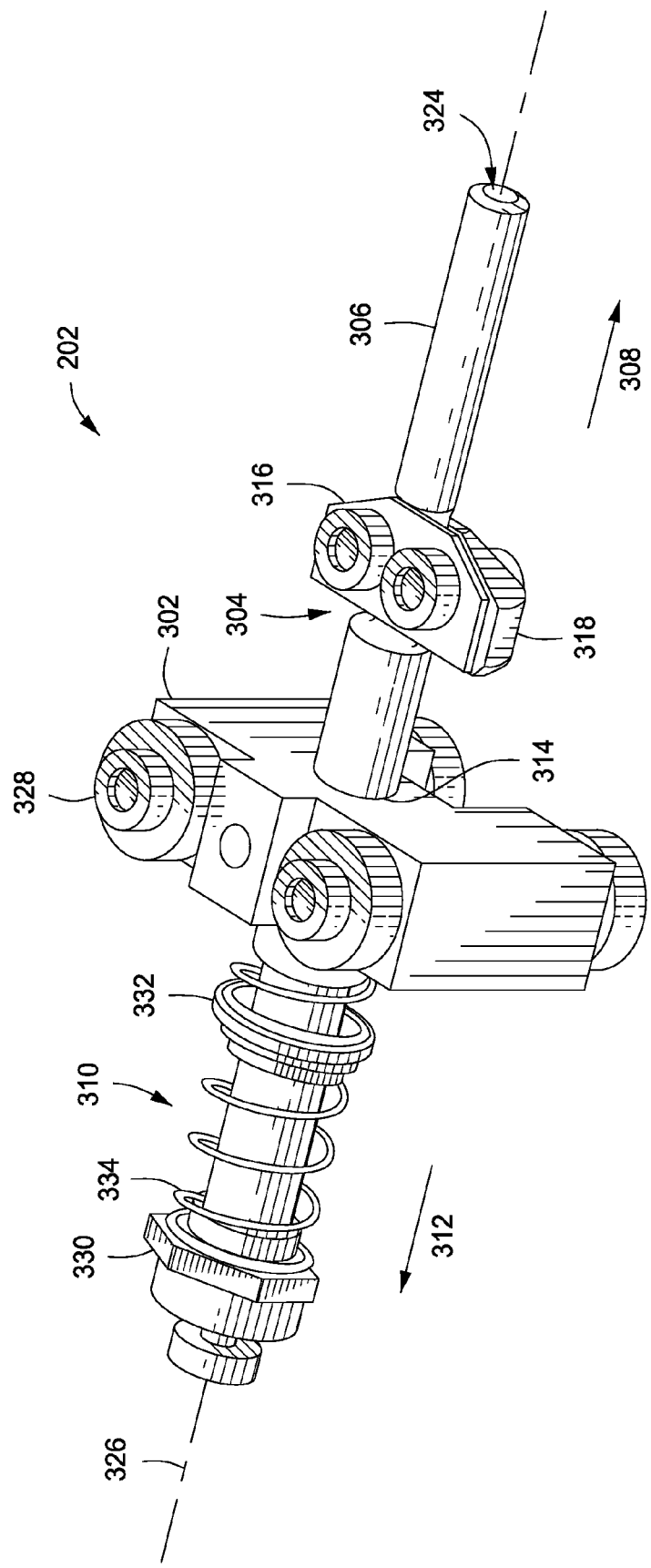
FIG. 3 is a terminal connector in accordance with some embodiments of the present invention.

FIG. 3 depicts the connectors 202 in accordance with some embodiments of the present invention. The connectors 202 may be used to tension the wires 110 in the process chamber 100. The wires 110 must be held at an appropriate tension (or within an appropriate tension range) at all times. The acceptable tension range may depend upon factors such as the composition of the wire, the diameter of the wire, the operating temperature of the wire, and the like. Too much tension in the wires may lead to breakage of the wire, while a lack of tension in the wires may result in wire sagging, which can result in the wire touching another object (for example, causing an electrical short, or if touching the shield 306, causing the wire to cool, which may lead to silicidation. Moreover, variation in the tension of the wire may also lead to wire fatigue and breakage.

The connector 202 is comprised of a base 302, a wire clamp 304 movably disposed with relation to the base 302 along an axis 326, a reflector shield 306 extending axially from the wire clamp 304 in a first direction 308 along the axis 326, and a tensioner 310 coupled to the base 302 and wire clamp 304 to bias the wire clamp 304 in a second direction 312 opposing the first direction 308. The base 302 includes a guide 314 to constrain movement of the wire clamp 304 in all directions except for linear movement of the wire clamp 304 with relation to the base 302 along the axis 326.

The wire clamp 304 may include a first clamping surface 316 and a second clamping surface 318 that may be biased towards each other to apply a force to the wire 110 when disposed therebetween sufficient to prevent the wire 110 from moving with relation to the wire clamp 304 upon the application of a given force to the wire 110, such as when axially tensioning the wire 110. The first clamping surface 316 or the second clamping surface 318 may be biased by one or more of a spring, a screw, a wedge, a cam, or the like. The wire clamp 304 may include an inner conduit 320 wherein the first clamping surface 316 and the second clamping surface 318 are disposed within the inner conduit 320. The wire clamp 304 may also include a terminal 336 for making an electrical connection from an external power source to the connector 202. For example, the terminal 336 may comprise a bolt threaded into the wire clamp 304, such as into a lower portion of the second clamping surface 318, to provide electrical connectivity to the wire at a point close to where the wire is held in the connector 202.

The reflector shield 306 includes an inner wall 322 defining a cylindrical opening 324 aligned with the axis 326 and extending along the axis 326 to cover the wire 110 from the wire clamp 304 to the opening 324 in the reflector shield 306. The inner wall 322 may be polished to reflect heat radiating from the wire 110 back towards the wire 110. The diameter of opening 324 may be about 2 to about 5 times the diameter of the wire 110. The length of the reflector shield 306 from wire clamp 304 to opening 324 is about 5 mm to about 50 mm, depending on the wire diameter and the wire temperature during use. In some embodiments, the reflector shield 306 may be a tube. The reflector shield 306 may extend from the wire clamp 304. Alternatively, the reflector shield 306 may be part of the wire clamp 304.

The connectors 202 comprise a base 302. The base 302 may be fabricated from suitable process compatible materials, such as aluminum, bronze, titanium, copper alloys, or the like.

The base 302 has a nut and bolt system 328 for attaching the base 302 to the process chamber 100. The wire clamp 304 is inserted through the guide 314 within the base 302. The reflector shield 306 extends axially into the process chamber 100 and comes into contact with precursor gases used in the CVD process. In one embodiment, the tensioner 310 includes a nut 330 and a spring 334. The nut 330, which can be made of any suitable material, such as a copper nickel silicone alloy or the like, is threaded onto the wire clamp 304. In some embodiments, a plurality of springs (e.g., two springs) may be provided. In such embodiments, a washer 332 may be interposed between adjacent springs, or the two springs. Alternatively, the washer 332 may be provided in single spring embodiments to facilitate free movement of the spring along the wire clamp 304. The washer 332 may be disposed over the wire clamp 304 and may move freely along the wire clamp 304. The washer 332 can be made of any suitable materials, such as an aluminum bronze alloy or the like, and may be disposed along the wire clamp 304 between the nut 330 and the base 302. The material choice for the nut 330 and/or the washer 332 may be selected to ensure smooth sliding on the wire clamp 304. The spring 334 is wound around the wire clamp 304, with one end connected to the nut 330 and the other end connected to the base 302. The spring 334 is chosen based on the material of the wire 110. The spring 334 must be able to allow the expansion of the wire 110 while also keeping the wire 110 in sufficient tension to prevent it from sagging without snapping. An alternative embodiment of the invention employs a two spring system for greater tension control. An electric current from an external source 112 connected to the process chamber 100 is coupled to the terminal connector 202 at any suitable location allowing the wire 110 to heat up (See FIG. 1). For example, electric current may be coupled to the terminal connector 202 at the wire clamp to facilitate providing a robust connection between the electric current provided and the wire retained in the clamp. The position of the spring 334 in the embodiment of FIG. 3 is advantageously removed from the hot wire to minimize thermal change in the spring that may affect the tension provided by the spring.

Figure 4:
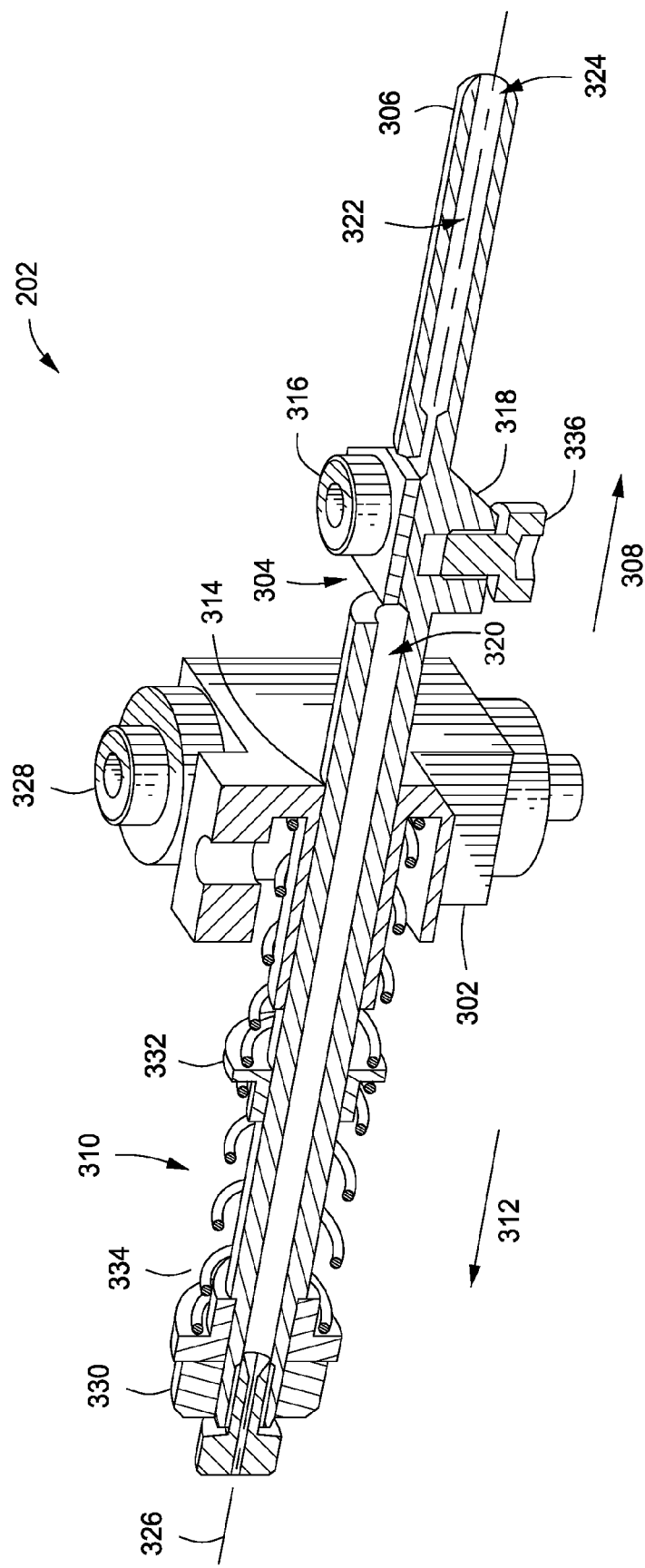
FIG. 4 is a cross section of the terminal connector shown in FIG. 3.

FIG. 4 is a cross section of FIG. 3. The inner wall 322 of the reflector shield 306 is highly polished so as to allow energy from the hot wire 110 to be reflected back towards the wire 110, thereby allowing the wire 110 in that portion to heat up faster than without the reflective shield 306. The presence of the reflective shield 306 prevents silicidation, or coating on the wire 110 and extends the life of the wire 110. The diameter of the interior of the reflective shield 306 must be wide enough to prevent the wire 110 from touching the interior surface but narrow enough to allow the wire 110 to heat up quickly. The diameter of the inner wall 322 of the reflective shield 306 may be the same as described above.

Figure 5:
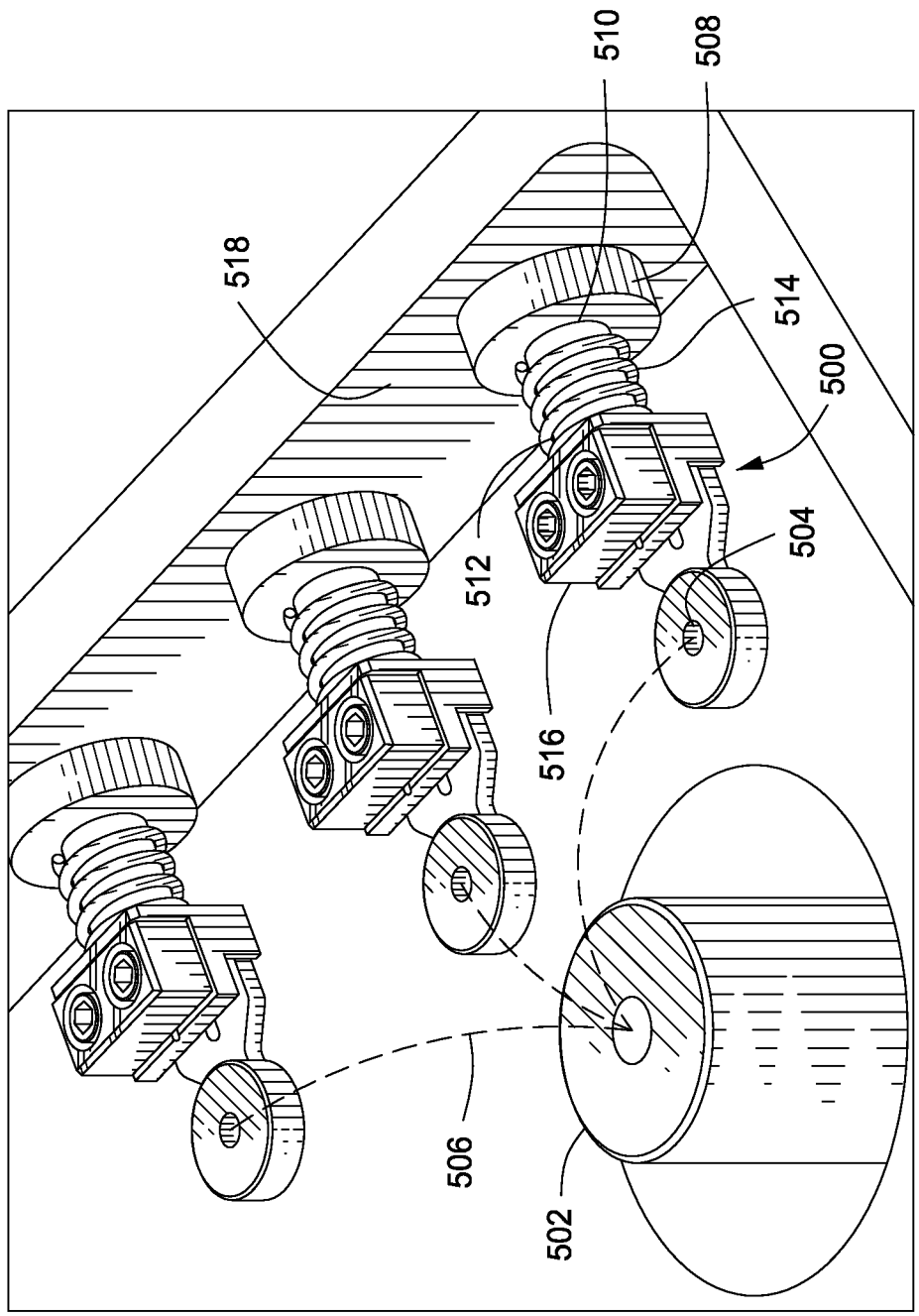
FIG. 5 is a plurality of terminal connectors in accordance with some embodiments of the present invention.

FIG. 5 depicts a plurality of terminal connectors in accordance with some embodiments of the present invention. The terminal connector 500 depicted in FIG. 5 comprises components similar to and performing a similar function as the components of the terminal connector 202 described above, except as noted below. Specifically, the terminal connector 500 comprises a base 508, coupled to a support structure 518, with a guide 510 disposed through the base 508, where the base 508 and guide 510 are similar to and perform a similar function to the base 302 and guide 314 described above. The terminal connector 500 further comprises a reflector shield 512, disposed through the guide 510, and a spring 514 wound around the reflector shield 512, where the reflector shield 512 and the spring 514 are similar to and perform a similar function to the reflector shield 306 and spring 334 described above. The terminal connector further comprises a wire clamp 516 that is similar to and performs a similar function to the wire clamp 304 described above. FIG. 5 additionally depicts a power feed 502 with connection cables 506 coupled to electrical connectors 504 to provide power to the terminal connectors. Other than the geometry and configuration of the terminal connectors, the primary difference between the terminal connector 500 and the terminal connector 202 is the position of the tensioning spring (514), which is closer to the heat source than the spring of the terminal connector described above with respect to FIG. 3.

Thus, an apparatus for tensioning and shielding wires in a process chamber from precursor gases used in the process chamber is provided herein. The inventive methods may advantageously provide an increase in the life of the wires used in the process chamber and prevent silicidation on the wires.

While the foregoing is directed to embodiments of the present invention, other and further embodiments of the invention may be devised without departing from the basic scope thereof.

The invention claimed is:

1. A terminal connector for a hot wire chemical vapor deposition (HWCVD) system, comprising:
    a base;
    a wire clamp moveably disposed with relation to the base along an axis, wherein the wire clamp further comprises a first clamping surface and a second clamping surface;
    a reflector shield extending from the wire clamp in a first direction along the axis, wherein an inner wall of the reflector shield is polished to reflect heat;
    a tensioner coupled to the base and wire clamp to bias the wire clamp in a second direction opposite the first direction;
    a guide disposed through the base to constrain movement of the wire clamp in all directions except for linear movement of the wire clamp with relation to the base; and
    an inner conduit, wherein the first clamping surface and the second clamping surface are disposed within the inner conduit.

2. The terminal connector of claim 1, wherein the base further comprises:
    a nut and a bolt system for attaching the stationary guiding mechanism to a hot wire chemical vapor deposition system.

3. The terminal connector of claim 2, wherein the base is made of aluminum, bronze, or a combination thereof.

4. The terminal connector of claim 1, wherein the first clamping surface and the second clamping surface are biased toward each other to apply a force to a wire disposed within the wire clamp.

5. The terminal connector of claim 1, wherein the first clamping surface and the second clamping surface are biased by at least one of a spring, a screw, a wedge or a cam.

6. The terminal connector of claim 1, wherein the wire clamp is made of stainless steel.

7. The terminal connector of claim 1, wherein the inner wall of the reflector shield defines a cylindrical opening aligned with the axis and extending along the axis to cover the wire.

8. The terminal connector of claim 7, wherein the diameter of the cylindrical opening is about 2 to about 5 times a diameter of a wire to be clamped in the wire clamp.

9. The terminal connector of claim 7, wherein the length of the reflector shield is about 5 to about 50 mm.

10. The terminal connector of claim 1, wherein the tensioner further comprises
   a nut threaded onto the wire clamp;
   a washer threaded onto the wire clamp between the nut and the base; and
   a spring wound around the wire clamp biasing the wire clamp in a second direction opposite the first direction.

11. The terminal connector of claim 10, wherein the spring is connected to the nut at a first end and connected to the base at a second end.

12. The terminal connector of claim 10, wherein the nut is made of a copper nickel silicone alloy.

13. The terminal connector of claim 10, wherein the washer is made of aluminum, bronze or a combination thereof.

14. A terminal connector for a hot wire chemical vapor deposition (HWCVD) system, comprising:
   a base;
   a wire clamp moveably disposed with relation to the base along an axis;
   a guide disposed through the base to constrain movement of the wire clamp in all directions except for linear movement of the wire clamp with relation to the base;
   a reflector shield extending from the wire clamp in a first direction along the axis, the reflector shield comprising an inner wall defining a cylindrical opening aligned with the axis and extending along the axis to cover the wire, wherein the inner wall is polished to reflect heat; and
   a tensioner coupled to the base and wire clamp to bias the wire clamp in a second direction opposite the first direction.

15. The terminal connector of claim 14, wherein the diameter of the cylindrical opening is about 2 to about 5 times a diameter of a wire to be clamped in the wire clamp.

16. The terminal connector of claim 14, wherein the length of the reflector shield is about 5 to about 50 mm.

17. A terminal connector for a hot wire chemical vapor deposition (HWCVD) system, comprising:
   a base;
   a wire clamp moveably disposed with relation to the base along an axis;
   a guide disposed through the base to constrain movement of the wire clamp in all directions except for linear movement of the wire clamp with relation to the base;
   a reflector shield extending from the wire clamp in a first direction along the axis and through the guide;
   a spring wound around the reflector shield and coupled between the base and the wire clamp to bias the wire clamp away from the base; and
   an electrical connector electrically coupled to the wire clamp to provide electrical power to a wire when retained in the wire clamp during use.

* * * * *